US007492800B2

(12) United States Patent
Bozso et al.

(10) Patent No.: US 7,492,800 B2
(45) Date of Patent: Feb. 17, 2009

(54) HIGH SPEED DATA CHANNEL INCLUDING A CMOS VCSEL DRIVER AND A HIGH PERFORMANCE PHOTODETECTOR AND CMOS PHOTORECEIVER

(75) Inventors: Ferenc M. Bozso, Ridgefeild, CT (US); Phillip G. Emma, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/876,605

(22) Filed: Oct. 22, 2007

(65) Prior Publication Data
US 2008/0049799 A1    Feb. 28, 2008

Related U.S. Application Data

(63) Continuation of application No. 10/305,516, filed on Nov. 27, 2002, now Pat. No. 7,339,963.

(51) Int. Cl.
*H01S 3/00* (2006.01)

(52) U.S. Cl. ............... 372/38.02; 372/38.1; 372/38.07; 372/43.01

(58) Field of Classification Search ............... 372/38.1, 372/38.02, 38.07
See application file for complete search history.

(56) References Cited

U.S. PATENT DOCUMENTS

| | | | |
|---|---|---|---|
| 3,634,697 A | 1/1972 | MacFarlane | |
| 4,243,951 A | 1/1981 | Wolkstein et al. | |
| 4,924,285 A | 5/1990 | Anderson et al. | |
| 5,495,464 A | 2/1996 | Fujikawa et al. | |
| 5,656,849 A * | 8/1997 | Burghartz et al. | ............ 257/528 |
| 6,215,295 B1 | 4/2001 | Smith, III | |
| 6,522,083 B1 | 2/2003 | Roach | |
| 6,587,489 B2 | 7/2003 | Schrödinger | |
| 6,720,585 B1 | 4/2004 | Wasserbauer et al. | |
| 6,816,642 B1 | 11/2004 | Mayer et al. | |
| 2001/0028665 A1 | 10/2001 | Stronczer | |
| 2002/0127744 A1 | 9/2002 | Gardner | |
| 2002/0181520 A1 | 12/2002 | Iguchi et al. | |
| 2003/0002551 A1* | 1/2003 | Kwon et al. | ............ 372/38.02 |

(Continued)

FOREIGN PATENT DOCUMENTS

JP          12-138415          5/2000

*Primary Examiner*—Dung T Nguyen
(74) *Attorney, Agent, or Firm*—Law Office of Charles W. Peterson, Jr.; Louis J. Percello, Esq.; Brian P. Verminski, Esq.

(57) ABSTRACT

A high speed optical channel including an optical driver and a photodetector in a CMOS photoreceiver. The optical channel driver includes a FET driver circuit driving a passive element (e.g., an integrated loop inductor) and a vertical cavity surface emitting laser (VCSEL) diode. The VCSEL diode is biased by a bias supply. The integrated loop inductor may be integrated in CMOS technology and on the same IC chip as either/both of the FET driver and the VCSEL diode. The photodetector is in a semiconductor (silicon) layer that may be on an insulator layer, i.e., SOI. One or more ultrathin metal electrodes (<2000 Å) on the silicon layer forms a Schottky barrier diode junction which in turn forms a quantum well containing a two dimensional electron gas between the ultrathin metal electrode and the Schottky barrier diode junction.

37 Claims, 15 Drawing Sheets

U.S. PATENT DOCUMENTS

2003/0160636 A1 8/2003 Fattaruso
2003/0201462 A1 10/2003 Pommer et al.
2004/0136658 A1 7/2004 Kropp

* cited by examiner

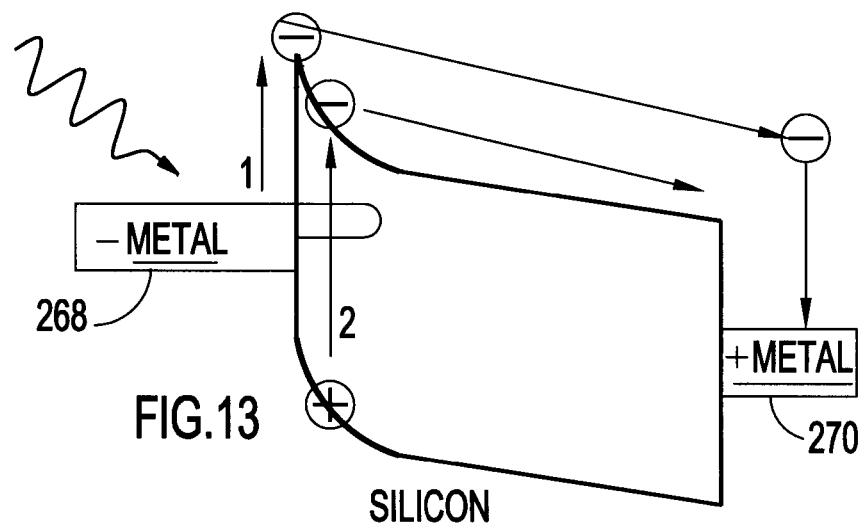
FIG. 13
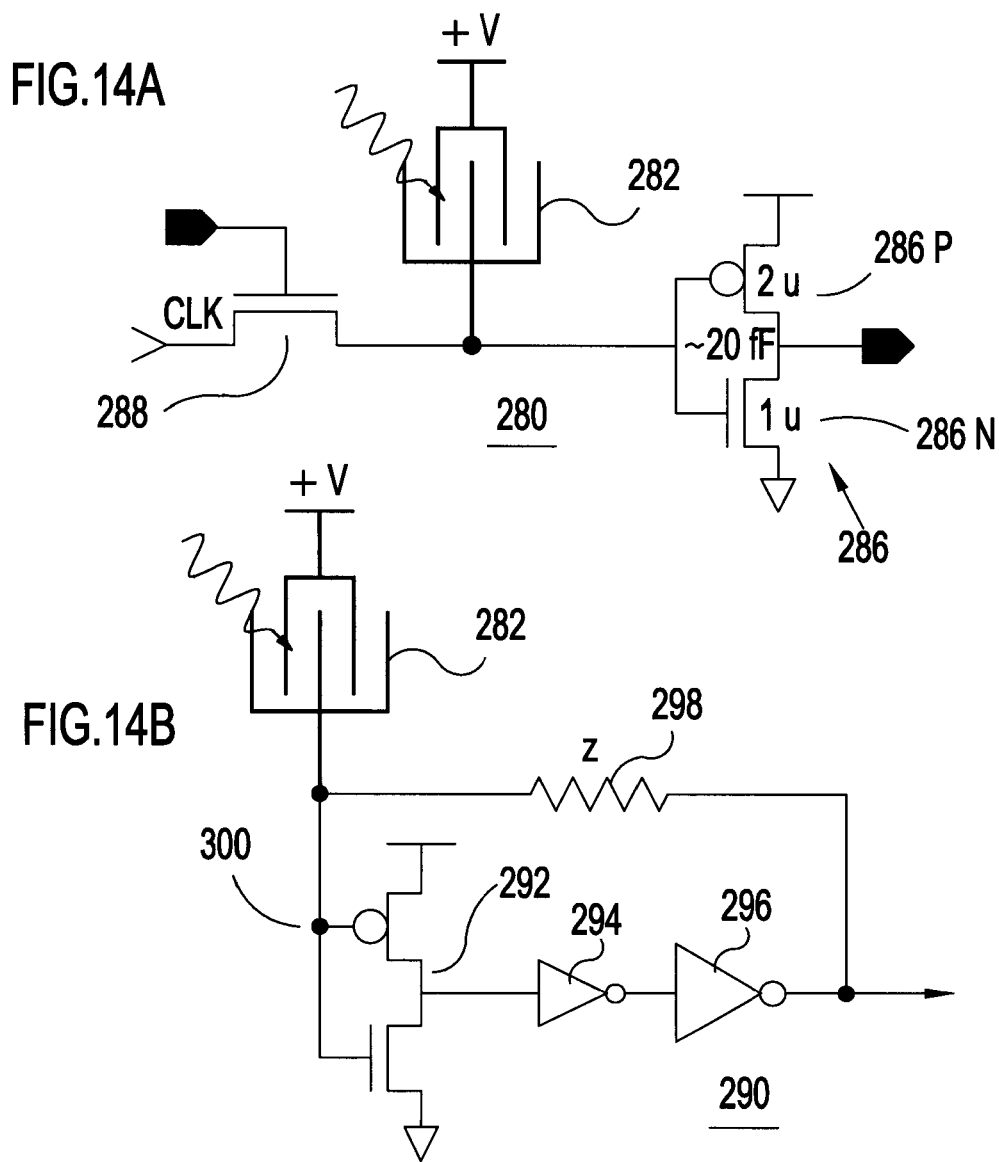
FIG. 14A
FIG. 14B

HIGH SPEED DATA CHANNEL INCLUDING A CMOS VCSEL DRIVER AND A HIGH PERFORMANCE PHOTODETECTOR AND CMOS PHOTORECEIVER

CROSS REFERENCE TO RELATED APPLICATIONS

The present application is a continuation of allowed U.S. patent application Ser. No. 10/305,516, entitled "HIGH SPEED DATA CHANNEL INCLUDING A CMOS VCSEL DRIVER AND A HIGH PERFORMANCE PHOTODETECTOR AND CMOS PHOTORECEIVER" to Ferenc BOZSO et al., filed Nov. 27, 2002, assigned to the assignee of the present invention and incorporated herein by reference.

BACKGROUND OF THE INVENTION

1. Field of the Invention

The present invention generally relates to high speed optical data transmission and more particularly to a data channel with a Vertical Cavity Surface Emitting Laser (VCSEL) diode CMOS driver and a high performance silicon photodetector.

2. Description of the Related Art

It is generally understood that as processor clock rates move further into the multi gigabit per second (Gbps) range, advanced information processing systems may require aggregate communication bandwidths upwards of Terrabit/sec. The typical data interconnect medium, copper wiring, is not expected to be suitable for such bandwidths. Facing a similar problem, the telecommunications and data communications industries have increasingly turned to optics. Thus, it is expected that optics will be used widely in high performance systems, e.g., for optical channels and busses. Optical media will replace electrical in these high performance systems, whether for communicating with a high performance server or in the server itself between frame subassemblies, between individual boards and even between chips on the same board or in the same module. However, most state of the art optical channels require expensive, high performance optical drivers and receivers in compound semiconductors, i.e., group III-V semiconductors such as, GaAs, InP, InGaAs and etc.

Generally, most state of the art high performance systems are based on the complementary insulated gate field effect transistor (FET) silicon technology commonly referred to as CMOS. Typically, much of the performance achieved in high performance communications devices is lost connecting a high performance (fast and sensitive) compound semiconductor element (i.e., a laser diode or a photodetector) to a CMOS driver or receiver. So, in addition to the cost of including a compound semiconductor elements, state of the art laser diode drivers or photoreceivers (i.e., a photodetector driving a receiver) lose much of the performance advantage in the connecting the element to the circuit. Efforts in combining these technologies (i.e., integrating compound semiconductor devices on the same chip with CMOS circuits) have not met with any widespread success and, typically, have proven to be very expensive. So, in spite of their excellent performance advantages, these compound semiconductor photodetectors and photoreceivers have found limited application to date.

State of the art silicon photodetectors also have limited use because of the indirect bandgap character of the silicon, which results in a much lower quantum yield (converting 10-20% of the photons into photocurrent) than direct bandgap compound semiconductors (detecting in excess of 90%). Further, silicon has lower carrier mobilities than compound semiconductors. Consequently, even though typically much more expensive than silicon, primarily, for state of the art high performance (fast and sensitive) photodetectors and laser diodes such as Vertical Cavity Surface Emitting Laser (VCSEL) diodes, compound semiconductors are used for operation at 10 Gbps and higher.

Although not on a practical level, high performance VCSEL diode drive has been achieved with a complex element known in the art as a coaxial radio frequency (RF) bias-T. A typical coaxial RF bias-T is a bulky and expensive element that can be used to drive an individual, discrete VCSEL laser diode. Essentially, the coaxial RF bias-T is reactive, with an input series capacitor driving a parallel output inductor. A bias or offset voltage is applied to one end of the inductor, a driver drives one end of the capacitor and the output at the common connection of the inductor and capacitor drives the laser diode. Thus, by applying an offset bias voltage to the inductor, the laser diode may be biased at or above turn on. An input gating signal passes through the capacitor and is superimposed on a DC bias voltage. Experimentally, such coaxial RF bias-T driven discrete VCSEL diodes have achieved 10 Gbps data rates. Thus, while coaxial RF bias-Ts might provide a laboratory solution for driving a few optical signals; they are not practical for optical busses, where the number of channels and, therefore, the number of VCSEL diodes can be 32, 64, 128 or even as high as 1024. So, because of their expense and bulk, using coaxial bias-Ts outside of the laboratory and particularly for wide channel applications is impractical.

Thus, there exists a need for high speed, low cost optical channels and especially for CMOS VCSEL diode drivers and for high speed, high quantum yield silicon photodetectors and photoreceivers that may be formed on low cost silicon and in particular on CMOS or SOI chips for cheap, simple, high-bandwidth optical interconnections and applications.

SUMMARY OF THE INVENTION

It is a purpose of the present invention to improve low cost data throughput.

The present invention is a high speed optical channel including an optical driver, a photodetector and CMOS photoreceiver. The optical channel driver includes a FET driver circuit (which may be a CMOS driver) driving an integrated passive element (e.g., an integrated loop inductor or a capacitor) and a vertical cavity surface emitting laser (VCSEL) diode. The VCSEL diode is biased by a bias supply. The integrated passive element may be integrated on the same CMOS IC chip as either/both of the FET driver and the VCSEL diode. The photodetector is in a semiconductor (silicon) layer that may be on an insulator layer, i.e., SOI. One or more ultrathin metal electrodes (<20 nm) on the silicon layer forms a Schottky barrier diode junction which in turn forms a two dimensional (2D) quantum well containing a 2D electron gas between the ultrathin metal electrode and the Schottky barrier diode junction. The photodetector drives a CMOS receiver, e.g., an inverter.

BRIEF DESCRIPTION OF THE DRAWINGS

The foregoing and other objects, aspects and advantages will be better understood from the following detailed description of illustrative embodiments of the invention with reference to the drawings, in which:

FIG. 13 graphically shows operation of the photodetector of FIGS. 12A-B;

FIGS. 14A-B are examples of preferred embodiment photoreceivers;

DESCRIPTION OF PREFERRED EMBODIMENTS OF THE INVENTION

Figure 1:
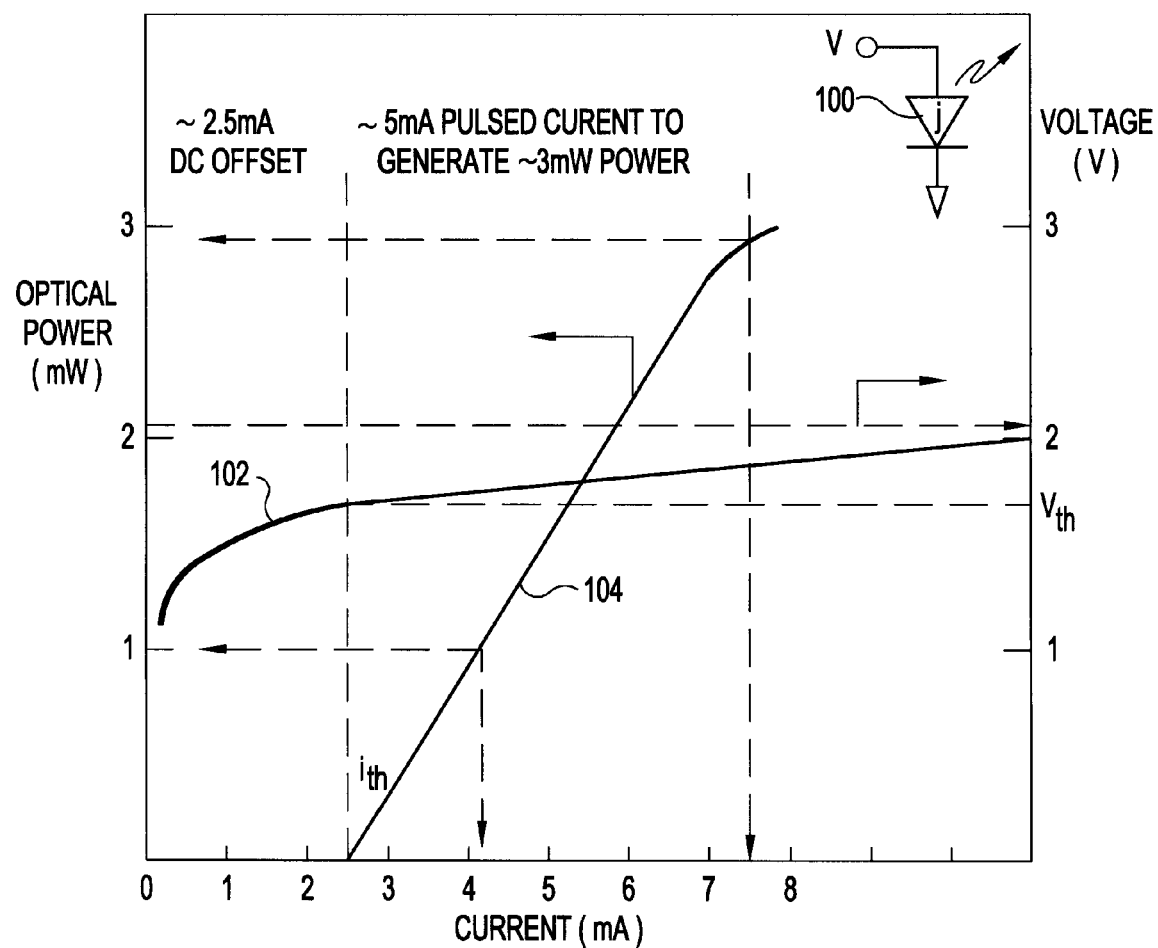
FIG. 1 shows an example of a light intensity—current/voltage (LI-IV) characteristic for a preferred embodiment short wavelength Vertical Cavity Surface Emitting Laser (VCSEL) diode.

Turning now to the drawings and, more particularly, FIG. 1 shows an example of a light intensity—current/voltage (LI-IV) characteristic for a preferred embodiment short wavelength (850 nm) Vertical Cavity Surface Emitting Laser (VCSEL) diode 100, such as may be driven at 10 Gigabits per second (Gbps) and beyond by a CMOS driver according to a preferred embodiment of the present invention. The VCSEL diode 100 has a current verses voltage (I/V) characteristic exhibited by curve 102 that is similar to any typical diode. Also, however, the light emission characteristic of the VCSEL diode 100 is represented by a light intensity verses current (LI) curve 104. The VCSEL diode begins to conduct current at or slightly above about 1.6 Volts (1.6V) and begins emission at 1.7V, i.e., its threshold voltage ($V_{th}$), and at a 1 milliamp (1 mA). its threshold on current ($I_{th}$). However, it does not begin to 1 ase at any appreciable level until 106, where it reaches a driving voltage of 1.8-2.0V at a device current of 4-8 mA to emit 3-3.5 milliWatts (3-3.5 mW) of optical power, near its maximum power the VCSEL diode 100 for continuous wave (CW) emission. Achieving 2V across the VCSEL diode is no simple task for a typical low voltage driver such as in 0.8-1.5V CMOS. The low voltage (CMOS) driver of the present invention drives one side of the VCSEL diode 100 at high performance, such that the voltage across the VCSEL diode reaches its driving voltage of 1.8-2.0V even at high data rates.

VCSEL diode 100 performance is improved by biasing it on at $V_{th}$ with the low voltage driver driving it to a total diode voltage of 1.8-2.0V. A forward biased semiconductor junction device such as VCSEL diode 100 responds to voltage changes much quicker than when it is off or reversed biased. The performance difference is known as turn on time or turn on delay. The turn on delay, which can be very significant, can be avoided by biasing the VCSEL diode 100 on, e.g., at 1.7V and 2 mA. Then, the biased VCSEL diode 100 is switched in and out of emission at much higher optical switching rates.

So, the VCSEL diode 100 is driven on and off by a low voltage driver circuit, preferably a CMOS driver. As noted hereinabove, the emission point for the VCSEL diode 100 is such that the low voltage driver alone cannot drive at a high enough level to place the VCSEL diode 100 in emission, i.e., the low voltage driver supply voltage ($V_{dd}$) is below $V_{th}$ and in some embodiments, $V_{dd}$ is almost half (½) $V_{th}$. Instead a bias voltage biases the VCSEL diode 100 at or just below emission and, the low voltage driver provides enough additional drive to drive the VCSEL diode 100 well into emission. One or more passive elements prevent the VCSEL diode 100 from turning off when the CMOS driver is not driving. Preferably, the passive element, which may be reactive or resistive or both, is a high Q reactive element, i.e., with minimum resistance. Thus, the passive element may be a high Q inductor or capacitor or a low resistance resistor. The passive element maintains current through the VCSEL diode at or slightly below its emission current with the CMOS driver selectively driving the VCSEL diode into emission.

Figure 2:
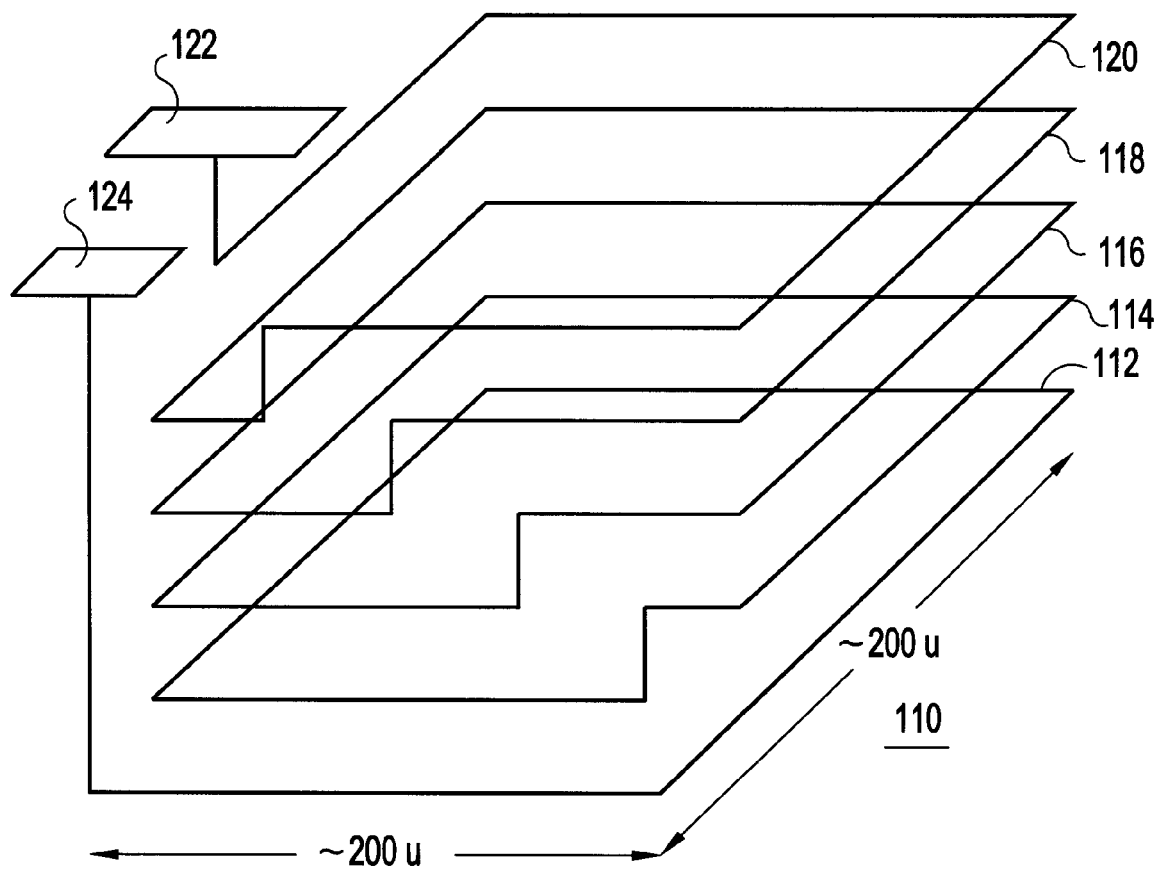
FIG. 2 shows an example of a single preferred passive element, a high Q integrated inductor or μinductor.

FIG. 2 shows an example of a single preferred passive element, a high Q integrated inductor 110 or micro-inductor (μinductor), that may be integrated on the driver chip, the VCSEL diode chip or on an intermediate chip attached to the driver and VCSEL diode chips. Likewise, the μinductor 110 may be included on a chip containing both the driver and the VCSEL diode. Essentially, this embodiment is implementable in any integrated circuit technology and in particular in CMOS wherein 6-8 metalization layers are available for standard on-chip interconnects. In this example, the μinductor 110 includes 5 loops 112, 114, 116, 118 and 120 on 5 adjacent wiring layers, e.g., copper wiring and originating/terminating at contact pads 122, 124. Furthermore, each loop 112, 114, 116, 118, 120 which is shown as square (for example only) may be any suitable shape, e.g., hexagonal, octagonal and etc., although preferred round loops are impractical. Each side of the square loops 112, 114, 116, 118, 120 of this example are 200-250 micrometers (μm) or microns such that each loop 112, 114, 116, 118, 120 is roughly 1 millimeter (mm) long. The inductor resistance is process dependent but, typically 25-50 Ω, 50 Ω, such that at 2 mA, voltage drop in the inductor is about 50 mV, i.e., negligible. Optionally, when multiple μinductors 110 are included on a single chip, they may share a single common bias pad 122 or 124, e.g., pad 124 may be connected to a common buried bias line (not shown) in the same wiring plane as loop 112.

Accordingly, by thus constructing a multi-turn inductor, the total inductance is exponentially proportional to the number (n) of loops, i.e., proportional to $n^2$. As a result, although the self inductance of a 1 mm long wire is approximately 1 nanoHenry (nH); the inductance of a 6 turn or 6 loop inductor is much higher than 6 times the approximately 1 nH self inductance per turn. Instead, due to the mutual inductance of the loops, the total inductance is 6×6×1 nH=36 nH. While typical chip attach technologies, e.g., wire bonding, inserts 1-2 nH at each chip input/output (I/O), this falls far short of the 25-50 nH range achieved by the μinductor 110 of the present invention. Thus, a useful inductance is achieved with an integrated passive element that would otherwise be unachievable because the prior art alternatives (in this example either providing a 36 mm (14") wire or a 200 micrometer (μm) on a side 6 loop coil) would be impractical and so, unusable.

Figure 3:
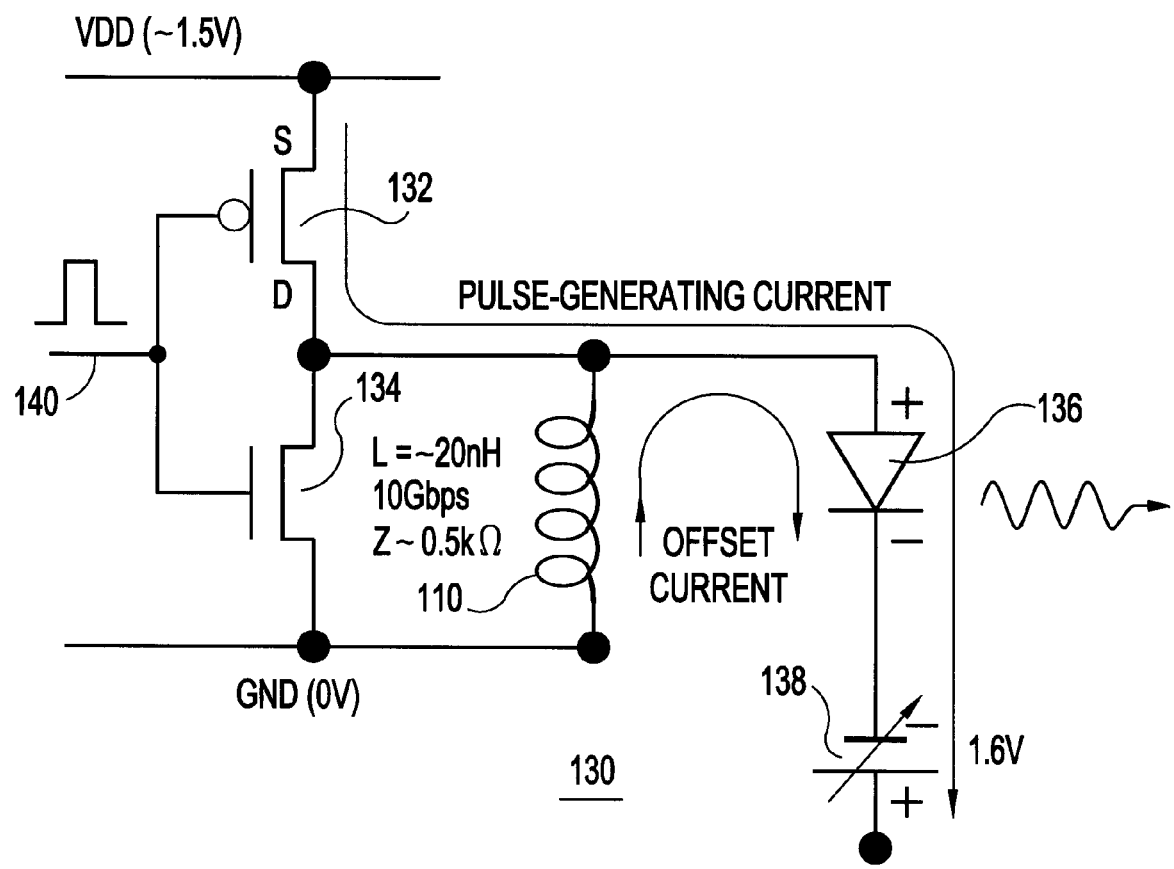
FIG. 3 shows an example of a preferred embodiment VCSEL including a high Q μinductor according to a preferred embodiment of the present invention.

FIG. 3 shows an example of a single chip 130 wherein the driver devices 132, 134, passive element (μinductor 110) and VCSEL diode 136 may be contained on a single chip according to a preferred embodiment of the present invention. The VCSEL diode 136 is biased at its cathode by an external negative voltage source 138, e.g., at −1.6V. In this example, the driver devices 132, 134 are in a CMOS inverter configuration with P-type field effect transistor (P-type FET or PFET) 132 between a normal 1.5V supply voltage and the anode of VCSEL diode 136 (i.e., at the inverter output). Optional N-type FET (NFET) 134 is connected in parallel with μinductor 110 between the anode of VCSEL diode 136 and ground.

At DC bias conditions, holding the inverter input 140 high, the inverter output at the anode of VCSEL diode 136 is at ground (0V) and bias current (on the order of 2 mA) is flowing from and through μinductor 110, through VCSEL diode 136 to the negative terminal of bias supply 138. So, the output at the anode of VCSEL diode 136 is low, essentially at ground, biasing the VCSEL diode 136 at or near emission. When the inverter input 140 is driven low, NFET 134 (if included) turns off, while PFET 132 turns on pulling the anode of VCSEL diode 136 higher until it enters emission. Thus, PFET 132 is sized to supply sufficient current to maintain the 2 mA current in the μinductor 110 and the 3+ mA through the VCSEL diode 136. Further, the current through the μinductor 110 remains, essentially 2 mA. This can be verified using basic well known circuit analysis techniques with the μinductor 110 inductance at 25-50 nH and μinductor voltage at 0.2-0.4V for the data period of a 10 gbaud signal, 100 picoseconds (100 ps). Finally, driving inverter input 140 high again turns off PFET 132 and current continues to flow from μinductor 110 through VCSEL diode 136, with μinductor current recovering to its same pre-emission level. If optional NFET 134 is included, it turns on when PFET 132 turns off and prevents the anode of VCSEL diode 136 from being pulled slightly negative by μinductor 110 as it recovers to its pre-emission level by clamping the anode of VCSEL diode, essentially, to ground.

As noted above, μinductor 110 can be replaced by a single low resistance (200-400 Ω,) resistor with a corresponding change in either the bias voltage or the size of PFET 132 to offset the current required to pull the resistor high enough to drive the VCSEL diode 136 into emission. Further, although shown in this example as having the VCSEL diode 136 biased by a negative supply 138 and pulled into emission by PFET 132, this is for example only. The present invention has application to any suitable circuit variation to provide the same result, e.g., biasing the anode of VCSEL diode 136 above $V_{dd}$ and pulling its cathode low to cause emission and etc.

Figure 4A:
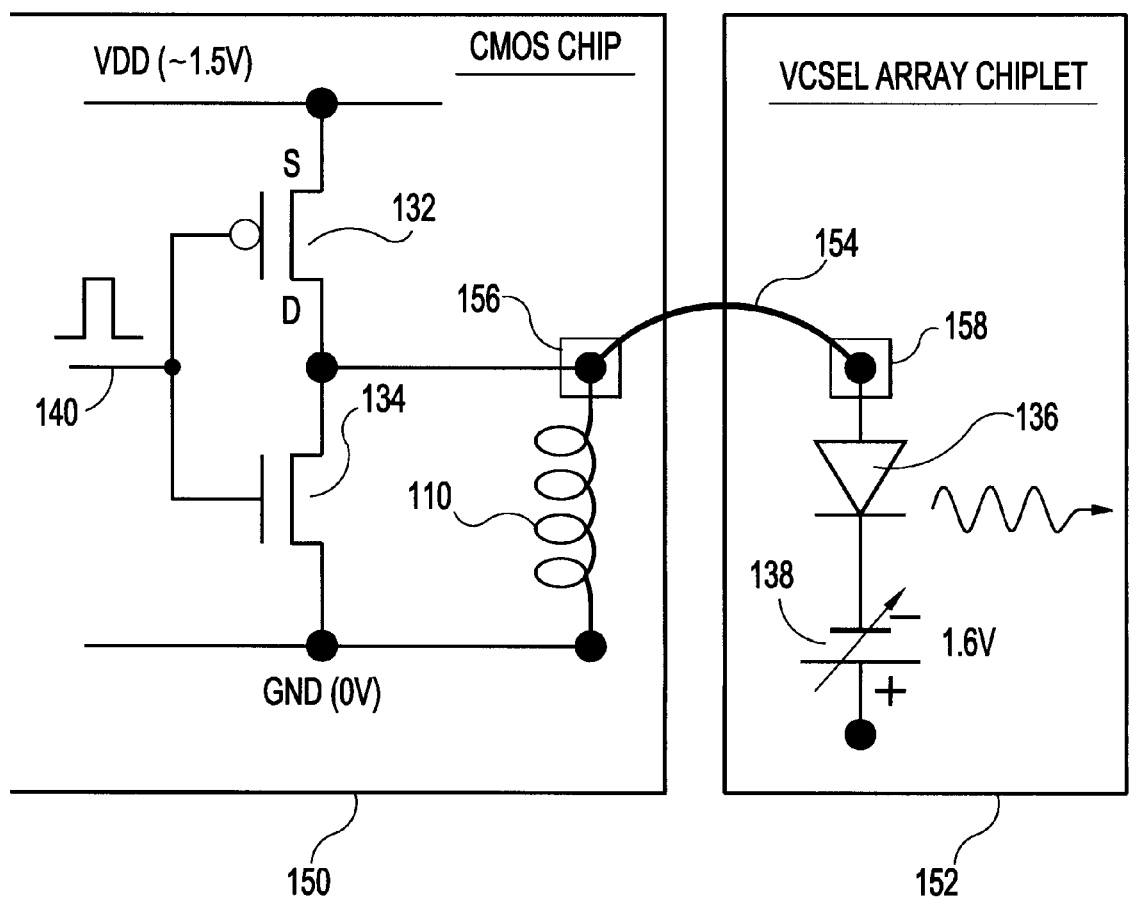
FIGS. 4A-B show variations on the example of FIG. 3.
Figure 4B:
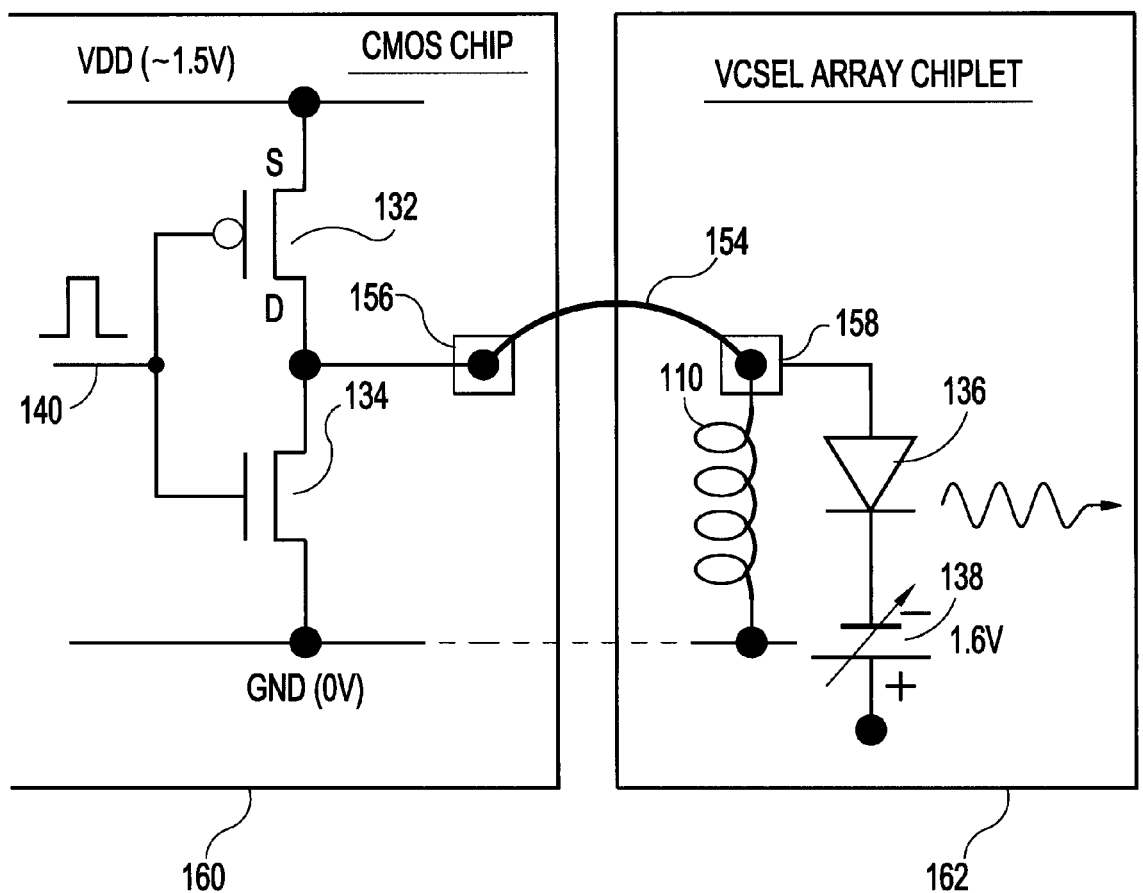

FIGS. 4A-B show multichip variations on the single chip 130 example of FIG. 3 with like elements labeled identically. In the example of FIG. 4A, the driver devices 132, 134 and μinductor(s) 110 are on a first chip 150, e.g., an optical bus driver chip. VCSEL diode(s) 136 are contained on a second chip 152, e.g., a VCSEL diode array chip with external negative voltage source 138 (e.g., at −1.6V) connected to the cathode of each VCSEL diode 136, typically at a single common connection for the entire array. An individual jumper 154 connects each driver output and its corresponding μinductor 110 at chip pad 156 to the anode of a corresponding VCSEL diode 136 at pad 158. By contrast in the example of FIG. 4B, the driver devices 132, 134 are on the first chip 160 and both μinductor(s) 110 and VCSEL diode(s) 136 are contained on a second chip 162. These two variations operate substantially identically with the embodiment of FIG. 3 with the jumper 154 adding 1-3 nH degrading the effectiveness of the μinductor 110 slightly.

Figure 5A:
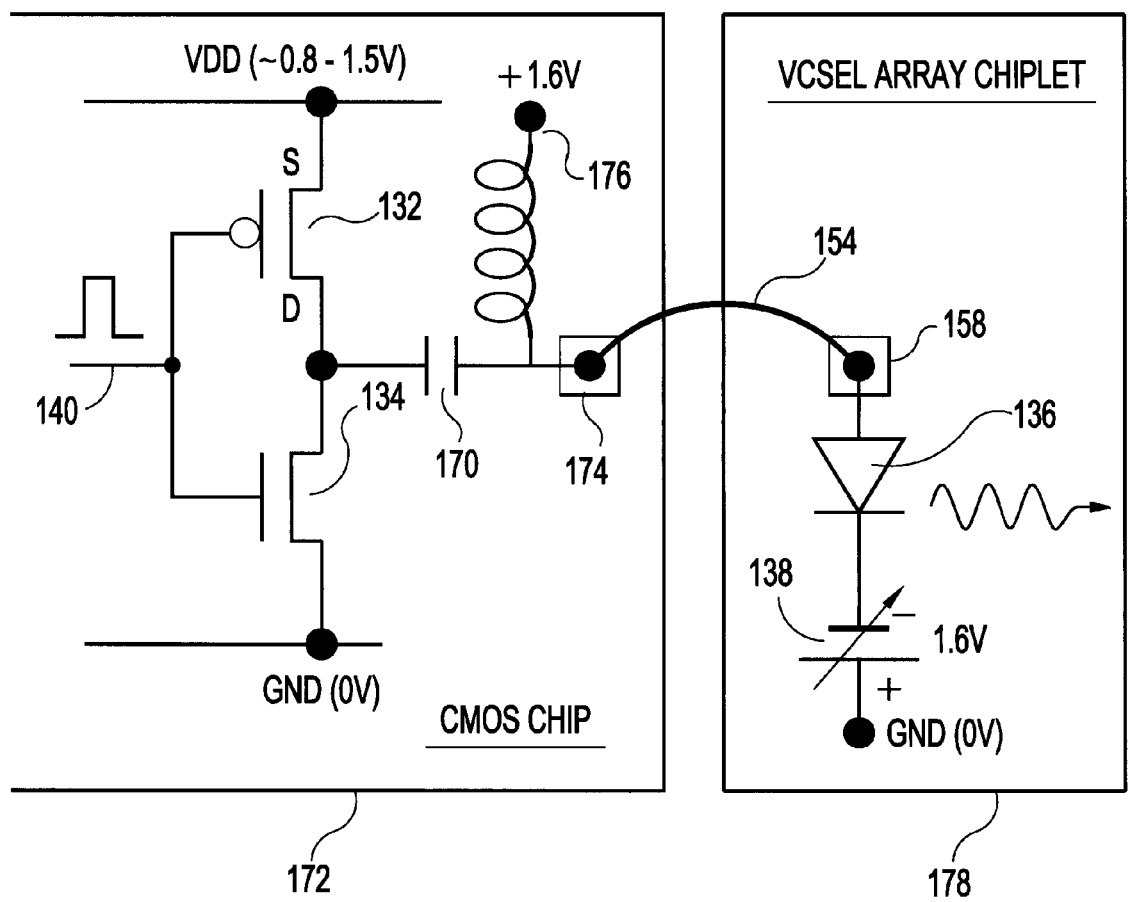
FIGS. 5A-B show further variations on the examples of FIGS. 4A-B.
Figure 5B:
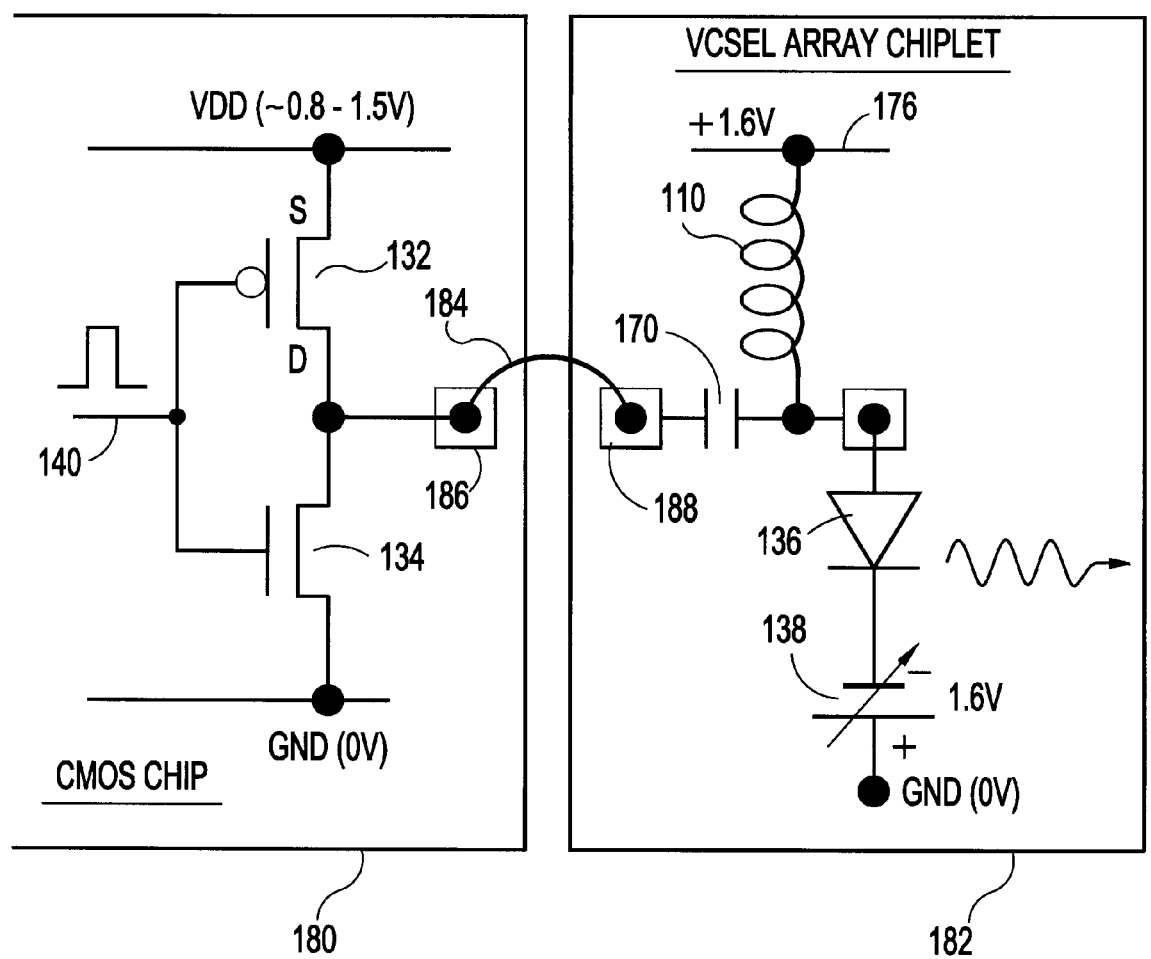

FIGS. 5A-B show a further variation on the multichip examples of FIGS. 4A-B with like elements labeled identically. These particular embodiment variations are effective where CMOS circuit supply voltage ($V_{dd}$) is lower than the emission voltage, e.g., 0.8V. An isolation/boost capacitor 170 is included in the driver chip 172 between the driver devices 132, 134 and corresponding μinductor(s) 110 and connected chip pad 174. Also, a bias supply voltage 176 is applied to one side of μinductor(s) 110 instead of ground, while the cathode of VCSEL diode(s) 136 is(are) grounded, i.e., bias supply 138 is set to 0V. Individual jumpers 154 connect each driver output 174 to the anode of a VCSEL diode 136 at pad 158 on the second chip 178. By contrast in the example of FIG. 5B, the driver devices 132, 134 are on the first chip 180 and both the isolation/boost capacitor(s) 170 and μinductor(s) 110 are contained on the second chip 182 with VCSEL diode(s) 136. Jumper 184 connects the driver output at pad 186 with the negative (low) side of isolation/boost capacitor 170 at pad 188.

These variations of FIGS. 5A-B operate slightly differently than the embodiments of FIGS. 3 and 4A-B, primarily because of isolation/boost capacitors 170. For example in FIG. 4A under DC bias conditions, the VCSEL diode 136 is on at 1.6V bias, passing current on the order of 2 mA which is also flowing through μinductor 110. When an input is applied to the driver devices 132, 134, charge accumulates on isolation/boost capacitor 170 such that the side connected to the μinductor 110 is positive with respect to the opposite side. Furthermore, driver devices 132, 134 are selected such that at operation, e.g., at 10 Gbaud, the capacitor neither charges nor discharges significantly.

Initially, a high is applied to input 140, isolation/boost capacitor 170 is charged, essentially, to 1.6V. When the input 140 is switched low, NFET 134 turns off and PFET 132 turns on pushing the negative side of isolation/boost capacitor up. However, the VCSEL diode 136 clamps the positive side of the isolation/boost capacitor 170 to about 2.0V as the μinductor 110 continues to pass 2 mA. With the isolation/boost capacitor 170 clamped at one side to 2.0V, the inverter output at the low side of the capacitor 170 rises, initially to approximately 0.4V and, begins to decay (as the capacitor 170 discharges) upwards towards $V_{dd}$ at a rate determined by PFET 132, which is selected by design. Again, preferably, by design very little decay occurs during the 100 ps or less of emission for a single bit. While more decay may occur during a string of several bits, the additional decay is still inconsequential unless the string is so long as to become a trivial/non-sensical string. By contrast when the input switches high again, the negative end of the isolation/boost capacitor 170 is pulled low again towards ground, which depending upon the magnitude of the decay also pulls the positive side down slightly. As the isolation boost capacitor 170 recharges with the output pad 174 approaching 1.6V. FIG. 5B operates substantially similarly to FIG. 5A.

It is understood that although graphically represented herein as an on chip variable voltage source or battery, bias supply 138 may simply be such as an external connection to a negative (−1.6V) external supply or any suitable bias voltage source. Further, on chip voltage generators are well known in the art for CMOS integrated circuits. Thus, voltage supply sources 138, 176 and may be such an on chip voltage generator or any other suitable voltage source, on chip or off.

Having thus provided a high performance, high speed optical data signal driver described hereinabove, suitable optical detectors/receivers are necessary to take advantage of that higher performance. Thus, a preferred embodiment optical channel includes a high performance photodetector, preferably a silicon photodetector for fabrication with a sense circuit on a CMOS chip. A preferred high performance photodetector has an ultrathin (e.g., 50 Å) metal quantum well structure for enhanced internal photoemission and has surface plasmon enhanced bandgap excitation and in particular, grating and edge assisted surface plasmon excitation.

Figure 6A:
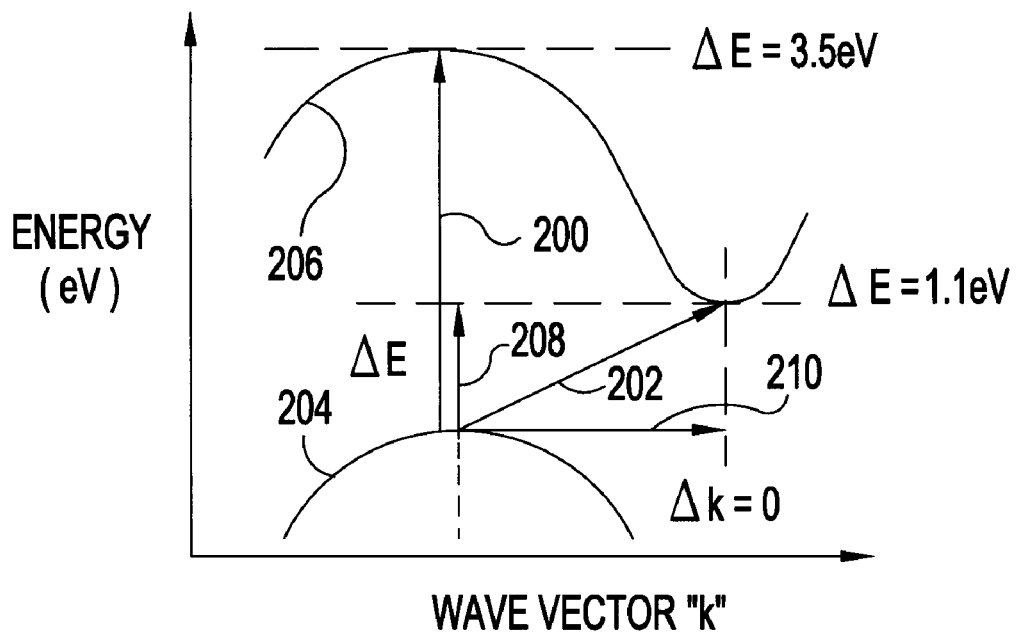
FIGS. 6A-B show the mechanism of direct bandgap excitation and indirect bandgap excitation in silicon with corresponding absorption coefficients.
Figure 6B:
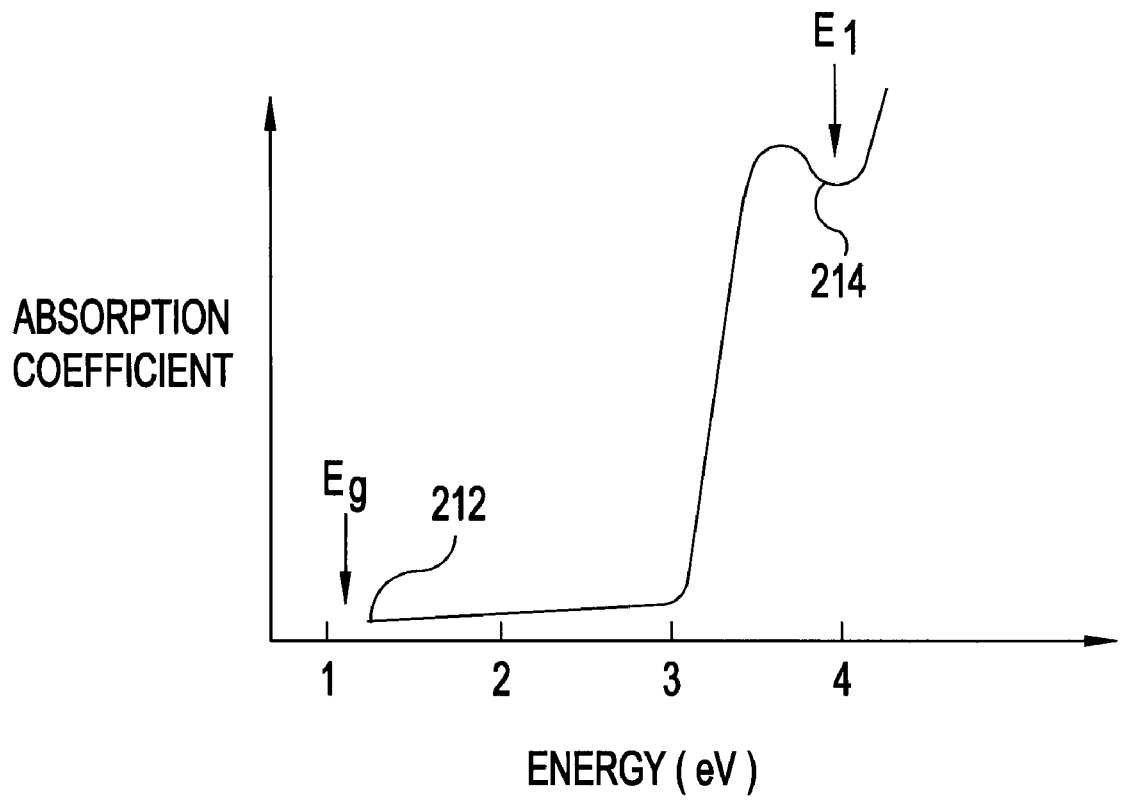

To facilitate understanding of preferred embodiment photodetectors, FIGS. 6A-B show the mechanism of direct bandgap excitation (represented by vector 200) and indirect bandgap excitation (represented by vector 202) in silicon and corresponding absorption coefficients. In particular, the physical origin of the difference between direct bandgap excitation 200 and indirect bandgap excitation 200 must be understood to understand how these excitations influence photo excitation in a cross section and, more particularly, affect sensitivity of a photodetector. So, for a direct bandgap excitation 200, the initial state 204 and final state 206 are separated by transition energy ($\Delta E$), 3.5 eV excitation for silicon which has a high absorption cross section. The electron momentum is the same in both the initial and final states 204, 206, respectively and, therefore, the change of momentum ($\Delta k$) from the transition is zero (0). Since $\Delta k=0$ in the photoexcitation process, photons only need to provide sufficient energy for the initial state-to-final state transition. Thus, for direct bandgap excitation 200 the laws of energy conversation and momentum conservation may be simplified to energy conservation, because there is no change in momentum.

By contrast, indirect bandgap excitations 202 have both an energy component 208 and, additionally, a momentum component 210 (i.e., $\Delta k>0$). So, the final state 206 is separated from the initial state 204 by some energy component ($\Delta E>0$). Since photons can only provide the energy component 208 and not the non-zero momentum component 210, as represented by the corresponding absorption coefficients, the excitation cross section 212 for the 1.1 eV indirect bandgap excitations 202 is orders of magnitude lower than 214 for the 3.5 eV of direct bandgap excitations 200. Thus, typically, 850 nm (~1.5 eV) photons can penetrate to about 10 μcm in (indirect bandgap) silicon compared with 100 nm an absorption length (or penetration depth) in direct bandgap semiconductors, two orders of magnitude farther.

The photodetector of the present invention overcomes the performance limiting impediments of the indirect bandgap character of silicon by using the indirect bandgap characteristics to enhance excitation. Thus, a preferred embodiment photodetector is a simple inexpensive high-speed, high-sensitivity CMOS-compatible photodetectors that may be fabricated on conventional bulk silicon wafers as well as on silicon on insulator (SOI) substrates. Further, the present invention has application to most other semiconductor technologies to fabricate more sensitive and less expensive simple photodetectors on other HEMT (High Electron Mobility Transistor) substrates, including SiGe.

Figure 7:
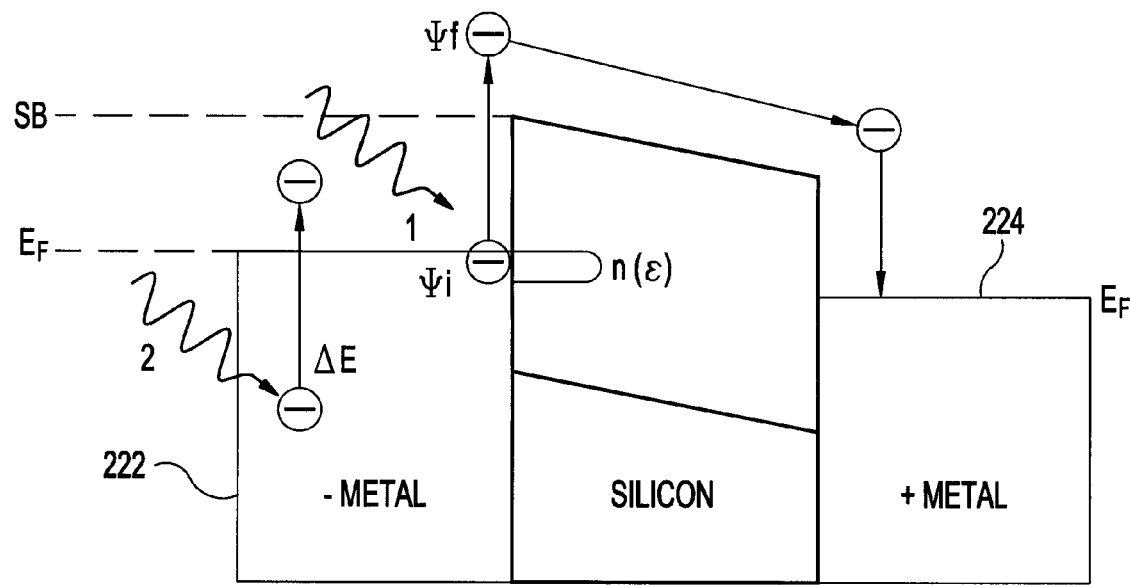
FIG. 7 shows an example of internal photoemission at a Schottky barrier diode for a metal-silicon-metal structure.

FIG. 7 shows an example of a preferred embodiment photodetector in an metal-silicon-metal structure 220 wherein internal photoemission from the inherent Schottky barrier diodes facilitates photodetection. Internal photoemission is known to occur in Schottky barriers and has been used to measure the height of the Schottky barrier potential at metal-semiconductor interfaces and also, in some recent high-speed Si and GaAs photodetectors. Essentially, photons excite metal electrons above the metal-semiconductor Schottky barrier interface. When a bias is applied to metal electrodes 222, 224 to form an electric field across the Schottky barrier, the excited electrons drift through the semiconductor valence band to a positively biased metal collector electrode 224.

A photo-induced state transitions from the initial state $\Psi i$ to final state $\Psi f$ that may be expressed as a transition matrix, $<\Psi f|\Delta \cdot A|\Psi i>$, where A is the vector potential. So, the transition probability is bounded by both the initial state vector and the final state vector, which describe local density of the initial and final states. Thus, the probability of metal electron photoexcitation to states above the Schottky barrier increases with a high density of initial states $n(\epsilon)$ at Fermi level. So, carriers excited from near Fermi level states beyond the Schottky barrier increases the photocarrier density but, not from deeper level excitations.

Accordingly, if the final state and the potential vector align, the transition probability is proportional to the density of initial states. Higher carrier density at the Fermi level, therefore, means a higher probability of carrier excitation and hence, higher detector quantum yield. The present invention achieves higher detector sensitivity by maximizing photocurrent yield through an ultrathin metal film Schottky barrier with the metal film thickness in the quantum well range, 100 Å or 10 nm.

Thus, according to the present invention, the ultrathin metal film on silicon forms a metal quantum well active layer on the silicon surface enhancing internal photoemission at the metal-semiconductor interface. The photodetector's ultrathin active layer (e.g., 10-300 Å and preferably <100 Å) enhances photon absorption as well as photocarrier generation to significantly improve the photoexcitation process. Thus, a quasi-two-dimensional electron gas in an ultrathin metal film is spatially confined by a potential well. To achieve a potential well width (i.e., the thickness of the ultrathin film) on the scale of the electron de Broglie wavelength, the quantum well active layer thickness is on the scale of 10 nm or less.

Figure 8:
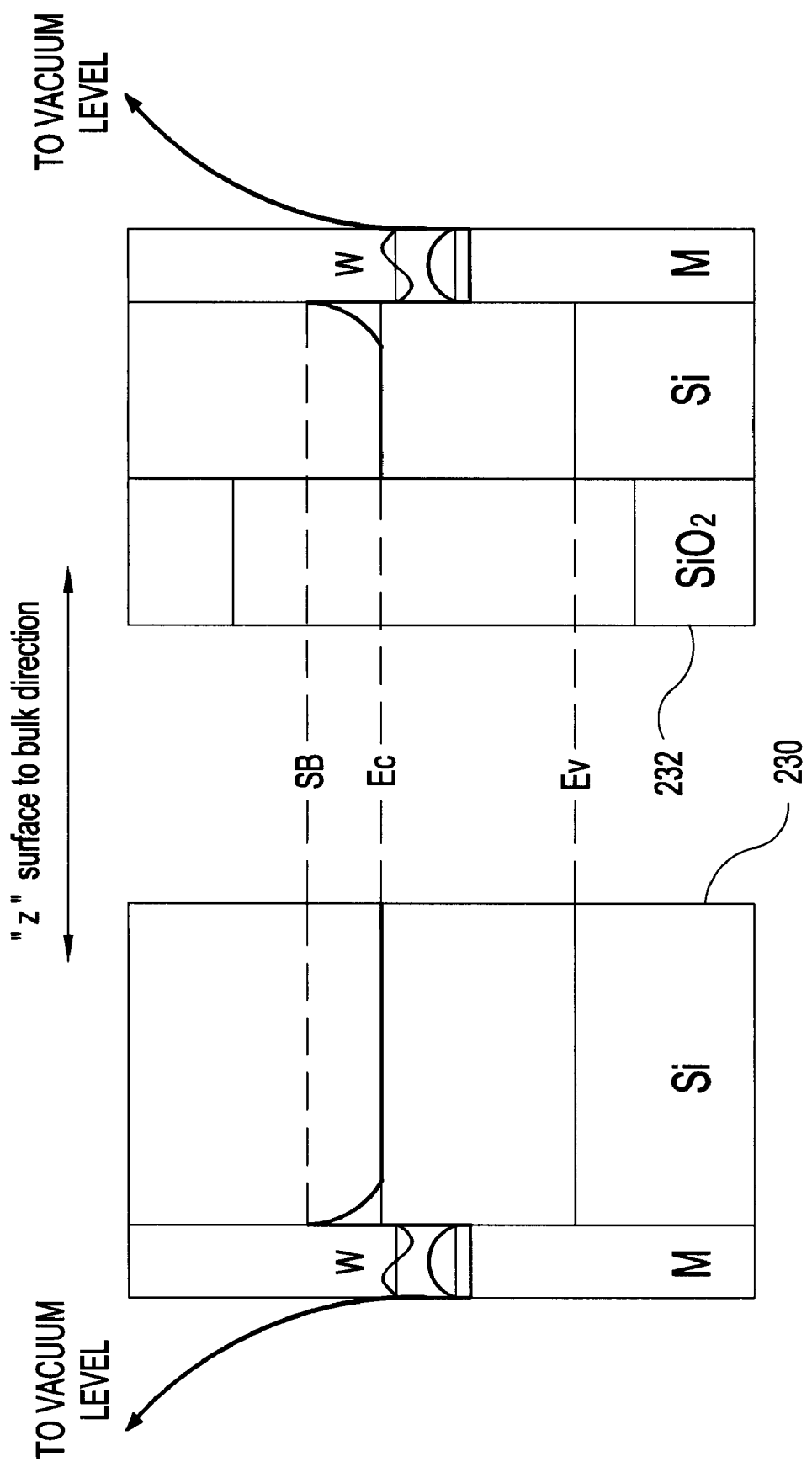
FIG. 8 shows an example of the confining potential of a preferred embodiment a metal-silicon Schottky contact of an ultrathin metal film quantum well on silicon and silicon on insulator.

FIG. 8 shows a diagrammatic example of the metal-silicon Schottky contact confining potential of a preferred embodiment ultrathin metal film quantum well on silicon 230 and silicon on insulator (SOI) 232. The Schottky barrier of the metal-silicon junction on the bulk-side of the detector forms one spatial confinement barrier (i.e., within the silicon) with the other confinement barrier formed by the vacuum-potential of the ultrathin metal film on the silicon surface or front-face of the detector. If a dielectric covers the metal film, then the bandgap of the dielectric forms the confining potential instead of the vacuum potential.

Figure 9:
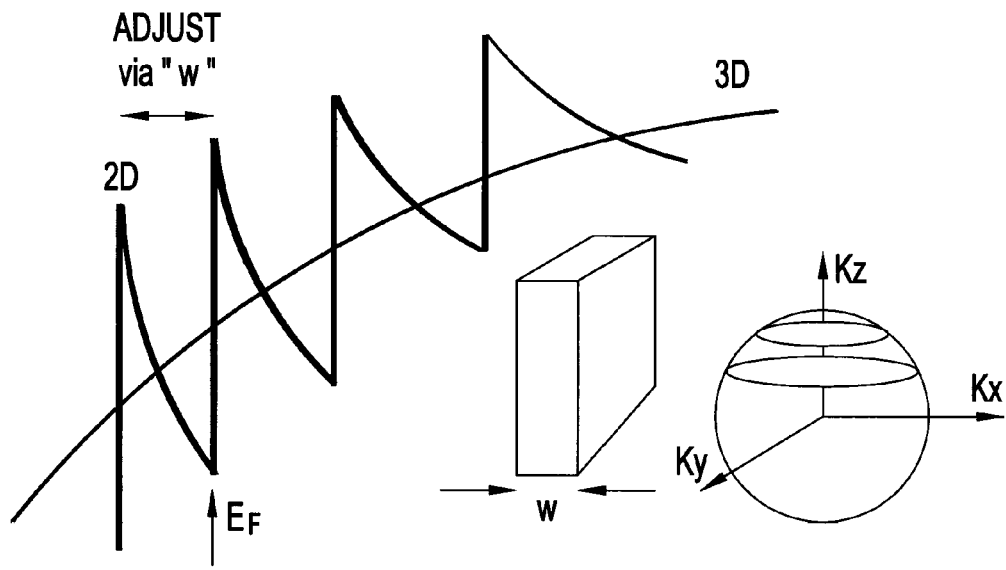
FIG. 9 shows how the quantum well layer thickness can be adjusted to tune local electric state density in different energy ranges.

FIG. 9 shows how the quantum well layer thickness can be adjusted to tune local electric state density in different energy ranges, effectively engineering electrical states. The structure can be formed such that a high density of quantum well states are at the Fermi level (EF). T. C. Chang in "Photoemission Studies of Quantum Well States in Thin Films," *Surface Science Reports,* 39 (2000), pp. 181-235, teaches using photoelectron spectroscopy to observe QW electronic states and for engineering the density of state formation. Further, depositing ultrathin metal films, monolayer by monolayer on different substrates photoelectron spectra has shown a remarkable presence of and evolution of the quantum well electronic states. Thus, a high density of electronic states can be formed at the Fermi level with proper metal film thickness tuning. The metallic quantum wells directly significantly enhance quantum yield and so, photodetector performance.

It is known that at such microscopic metal structures, e.g., sub-wavelength size metallic structures, characteristically show peculiar electrical and optical properties at optical frequencies. These peculiar properties do not even remotely resemble the metal's larger bulk properties. For example, although at normal thicknesses metallic films are almost perfect reflectors and, because of conservation of momentum, neither absorb nor transmit light to any significant extent. By contrast however, metallic film structures with microscopic irregularities or periodicities show strong optical absorption. This strong optical absorption by such metallic microscopic features is a result of surface plasmon excitation.

Surface plasmons are induced surface charge density oscillations, i.e., surface electromagnetic waves that are described by Maxwell's equations. Metals have a negative real part of the dielectric constant for optical frequencies below the plasmon resonant frequency, while the dielectric constant in dielectrics or a vacuum is positive. So, the real part of dielectric constants on opposite sides of metal/dielectric interfaces have opposite signs. So, light can excite surface plasmons and surface electromagnetic waves in freestanding metal films as well as in ultrathin metal films on semiconductor surfaces such as the structure 230, 232 of FIG. 8. At electromagnetic resonance, i.e., when the energy and in-plane momentum of the incident light matches that of the surface plasmon modes of the metal film, strong optical absorption occurs. Electromagnetic resonance leads to a resonance-buildup of local electromagnetic fields in and near the metal film. Local electromagnetic field enhancement can exceed the incident optical fields by a factor of $10^2$ to $10^6$. Such strong local electromagnetic fields have what are known as giant effects in nonlinear optical processes (e.g., surface enhanced Raman spectroscopy, second harmonic generation, sum frequency generation), as well as in linear processes like plasmon enhanced photoemission. A similar giant local field effect operates in the photodetector bandgap excitation as well. Thus, such plasmon resonance in ultrathin metal films on silicon provides high-sensitivity high-speed metal-silicon-metal photodetectors according to the present invention.

Figure 10:
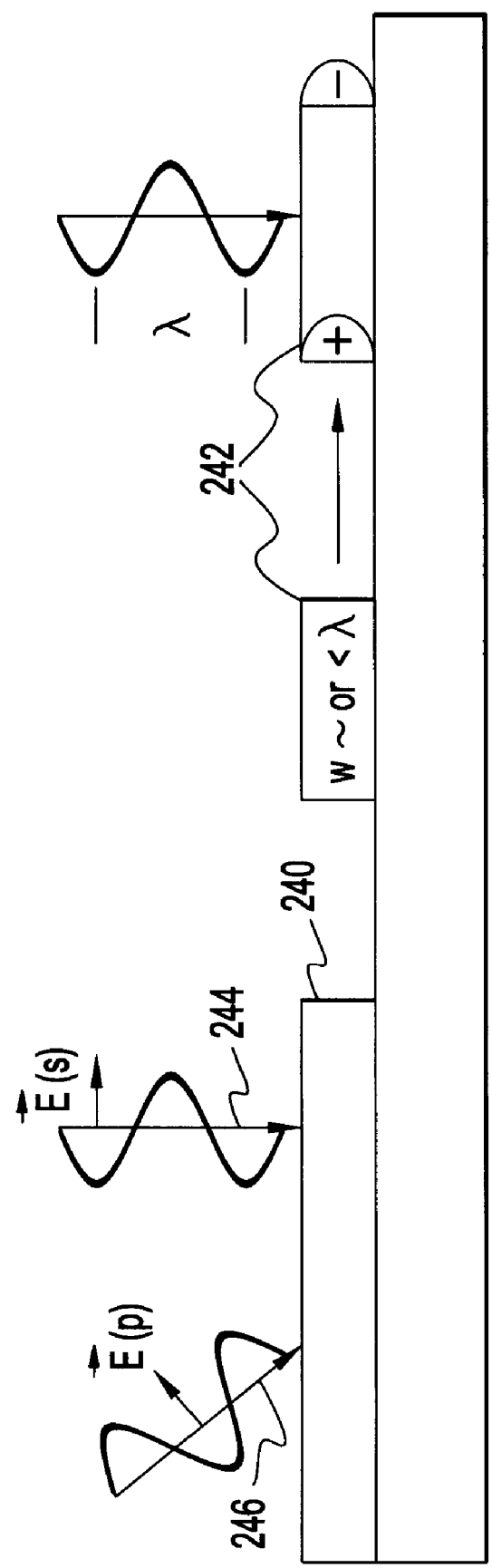
FIG. 10 show an example of surface plasmon excitation comparing normal behavior of an extended flat metal film against features formed of the same metal film with linear dimensions on the scale of the photon wavelength λ or less.

FIG. 10 shows an example of surface plasmon excitation comparing normal behavior of an extended flat metal film 240 against features 242 formed of the same metal film with linear dimensions on the scale of the photon wavelength $\lambda$ or less according to a preferred embodiment of the present invention. An s-polarized photon 244 cannot couple to the extended flat metal film 240 because it cannot induce charge on an equipotential conducting surface. Further, momentum conservation prevents p-polarized photon 246 from coupling to the extended flat metal film 240. By contrast, p-polarized photons couple to a metal strip 242 which has a width on the scale of $\lambda$ or less. Thus, photons can excite charge density oscillation in the $\lambda$ sized features at the photon frequency ($\omega$) induced by the driving photon field. The phase and amplitude of the induced oscillation, however, depends on $\omega-\omega_0$, where $\omega_0$ is the plasmon resonance frequency.

Figure 11:
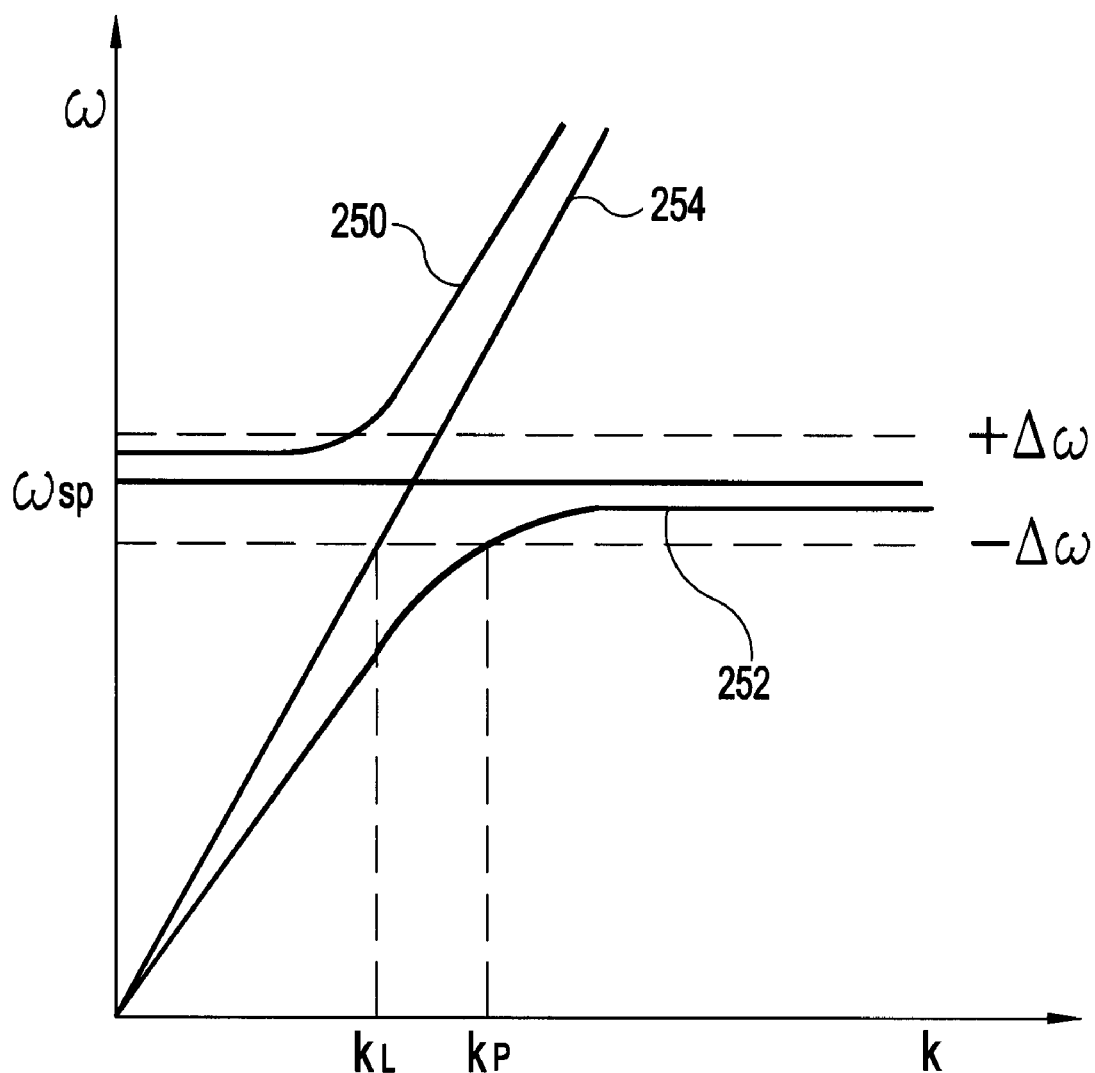
FIG. 11 shows the dispersion relations for light and for surface plasmons.

FIG. 11 shows the dispersion relations for light 250 and for surface plasmons 252, which are each a correlation between the frequency of electromagnetic oscillation and its momentum. The $\omega=ck$ lightline 254 shows the linear relationship between the photon's wavevector (k) and its frequency. The nonlinear surface plasmon dispersion curve 252 lies to the right of and below the lightline 254. This means that for the same energy photons and plasmons (i.e. for the same $\omega$) plasmon momentum is always larger than photon momentum. As a consequence, photons alone could never excite surface plasmons. For example, at ($\omega_P-\Delta\omega$) frequency, $k_L<k_P$, i.e. the momentum of the photon is smaller than that of the surface plasmon.

However, photons can be transformed into surface plasmons by selecting proper spatial metal film structures (e.g., a grating) on silicon. High spatial frequency Fourier components in the selected structure or grating provide any necessary additional momentum for plasmon excitation. So, the structure is selected for its surface plasmon excitement response to its grating coupling, edge coupling and surface roughness coupling. The structure is constrained further in that the metallic film must exhibit plasmon resonance at the energy of the incident photons. Surface plasmon resonance shifts downwards with the size of microscopic metallic structures, i.e., thinner film means lower plasmon resonance frequency.

Photon excited surface plasmons at or near the resonance frequency provide momentum for further electron excitation, including indirect bandgap excitation in silicon. Further within $+/-\Delta\omega$ of the plasmon resonance frequency, the plasmon momentum can be an arbitrarily large value to provide momentum to match any momentum conservation scenario. Accordingly, the present invention provides a new efficient use for indirect bandgap excitation in silicon. Plasmons provide both energy and momentum for the indirect bandgap excitation to achieve a probability of transitions comparable to that of direct bandgap excitations.

Figure 12A:
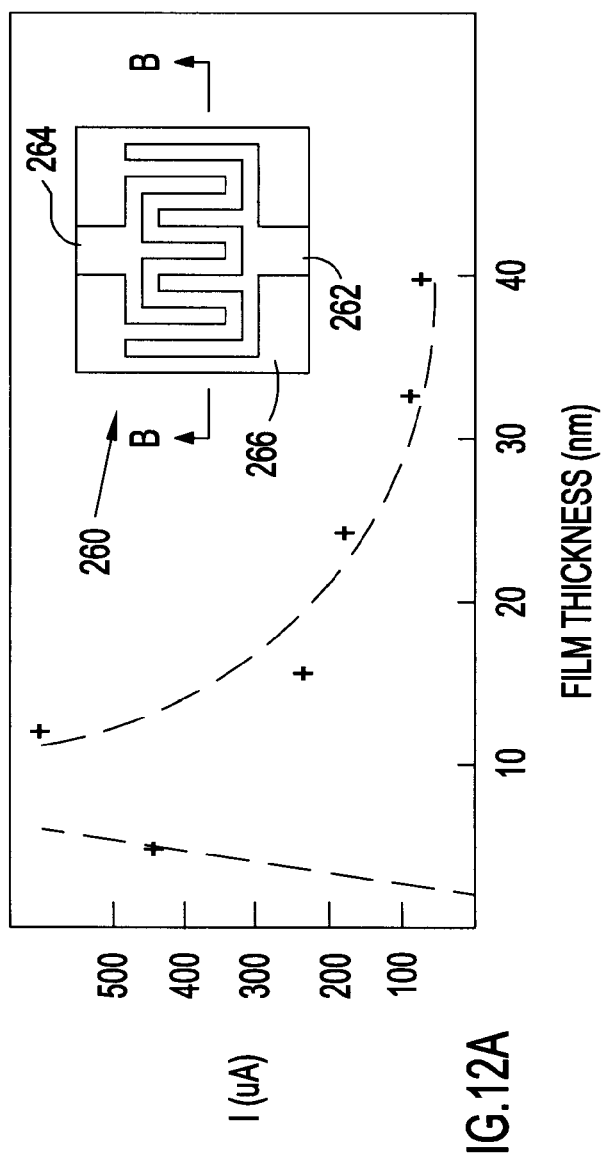
FIG. 12A shows the photoexcitation process efficiency for tungsten.

FIG. 12A shows the photocurrent (i.e., the efficiency of photoexcitation) of a tungsten/silicon (W/Si) photodetector 260 as a function of metal film thickness. Although almost any metal may be used, tungsten was used for example only to form the metal grate that includes a positive photodetector electrode 262 and a negative photodetector electrode 264 on a silicon layer 266. In this example, the 2000 Å (200 nm) metal grid 262, 264 is thinned with hydrogen peroxide ($H_2O_2$) and exposed to 3 mW of optical power from a VCSEL diode, i.e., 1.5 eV at 850 nm. Since thinning the metal grate from 2000 Å to 400 Å provided little measurable response, if any, that data is omitted from the graph. However, below 400 Å the change in current response is dramatic, peaking at about 100 Å. In particular, this high photocurrent at 100 Å occurs when the edge region of the metal (tungsten) film is exposed to the laser light. By contrast, directing the laser to clean silicon, e.g., in regions outside the tungsten film, or to the center region of an extended flat tungsten film (e.g., 240 in FIG. 10), results on significantly less detectable photocurrent. Thus, by selecting the proper thickness for the particular metal, plasmon resonance can be selected to respond to VCSEL diodes.

Figure 12B:
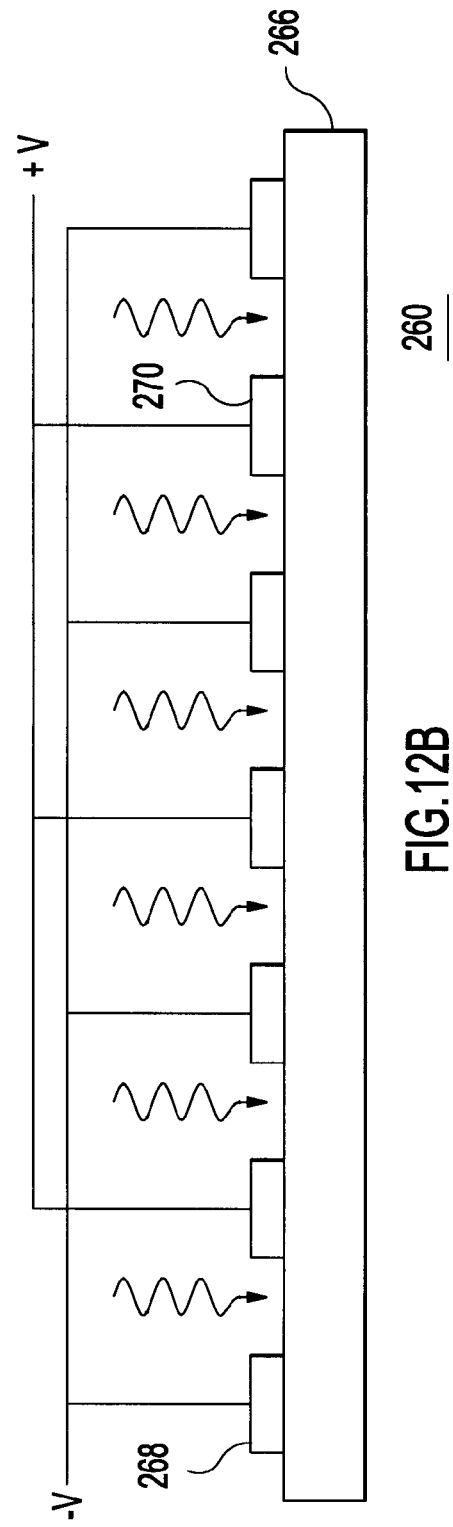
FIG. 12B shows a cross section of the W/Si photodetector of FIG. 12A through B-B.

FIG. 12B shows a cross section of the W/Si photodetector 260 of FIG. 12A through B-B. Alternating thin metal (W) fingers 268, 270 of electrodes 262, 264, respectively, form shallow Schottky barrier diode junctions with the surface 272 of the silicon layer 266.

FIG. 13 graphically shows operation of a preferred embodiment photodetector (e.g., 260) between two fingers 268, 270. Internal photoemission is enhanced by the quantum well nature of the ultrathin metal film grate (fingers 268, 270) on silicon with plasmon mediated local fields enhancing indirect bandgap excitation according to the present invention. The ultrathin metal grating (268 270) on silicon (266 in FIG. 12) forms a high local density of electronic states near the Fermi level. The surface plasmons add both energy and momentum for high efficiency indirect bandgap excitation. Also, plasmon resonance causes huge local field enhancement at the edges of the metal film grate to silicon interface. As a result of this huge field enhancement, bandgap excitation occurs near the edges in the depletion region and near the Schottky interface to photogenerate hole and electron pairs. The strong potential field of the Schottky barrier cause the holes, which normally have low mobility, to be swept immediately to the negatively biased metal. Simultaneously, the much higher mobility electrons drift in the combined field of the Schottky potential and the detector bias potential towards the positive electrode.

Advantageously, this exceptionally favorable situation at the ultrathin grating provides an unusually high quantum yield and high detector speed. In particular a photodetector such as the one for the example of FIGS. 12A-B and 13 has a responsivity that corresponds to approximately 30% quantum yield. Thus, current on the order of 0.2 mA (200 μA)/mW optical power can be realized from a 13 tungsten finger 268, 270 (each 25 μm long) on 2 μm pitch on silicon. Thus, since an 850 nm VCSEL as described above, provides 3 mW optical power, directing that power through a typical state of the art optical link should impart 1 mW of optical power to the photodetector, thereby inducing 0.2 mA current through the photodetector. This current can be provided directly to the gate of an FET or FETs such that almost any type of circuit may act as a receiver.

FIGS. 14A-B are examples of preferred embodiment photoreceivers 280, 290. In the first embodiment, the 13 finger 25 μm photodetector 282 is attached between a supply voltage, e.g., $V_{dd}$, and the input 284 of a CMOS inverter 286, which is the gate of NFET 286N and PFET 286P. A precharge pass gate 288 is connected to the inverter input 284 and gated by a clock. Preferably, for quicker response, the precharge voltage is less than half $V_{dd}$ and more preferably one third (⅓) $V_{dd}$, i.e., at or below $V_T$. Total node capacitance at the inverter input 284 is on the order of 20 femtoFarads (fF). When the clock (clk) is high, pass gate 288 is on discharging the inverter input 284 to the precharge voltage. The clock returns low to turn pass gate 288 off, the inverter input 284 remains at the precharge voltage and the inverter output is high. When 1 mW laser light strikes the photodetector 282, it passes 200 μA, which charges the inverter input. Since, Q=CV and I=C*ΔV/Δt, a 100 ps laser pulse to the photodetector 282, which corresponds to 10 Gbps, provides sufficient current to charge the inverter input 284 to 1V, which is sufficient voltage to switch the inverter. When the light stops, the inverter input 284 is returned to its precharge state.

FIG. 14B shows an example of a Trans Impedance Amplifier (TIA) photoreceiver 290, which includes three inverters 292, 294, 296 and feed back impedance or resistor 298. In this embodiment the 13 finger 25 μm photodetector 282 is attached between a supply voltage, e.g., $V_{dd}$, and the input node 300 to one inverter 292 at bias resistor 298. Bias resistor 298 is selected to keep the three inverters from oscillating and stable at a steady state equilibrium voltage with no light to the photodetector 282. When light is provided to the photodetector 282, the photodetector 282 passes current to pull input node 300 high. In response, inverter 292 drives its output, the input to inverter 294, low. Inverter 294 drives its output, the input to inverter 296, high. Inverter 296 drives its output low. By biasing the 3 inverters 292, 294, 296 at equilibrium the TIA 290 has a much faster response time than the simple embodiment 280 of FIG. 14A. Thus, the photoreceivers 280, 290 of FIGS. 14A-B are high performance CMOS photoreceivers that can be formed on a single CMOS IC. Further, it is understood that if more charge is needed, e.g., to drive a larger inverter 286, photodetector 282 can be increased by adding fingers 264, 266, by increasing finger length or both.

Also, since the electrical and optical properties of ultrathin metallic film quantum wells are determined, primarily, by the nature of the spatial confinement, i.e., the thickness of the film and the height and shape of the potential well, the present invention has wide application. Although described for metal on silicon, the present invention may be applied to nearly any metal and semiconductor or composite thereof to achieve the above described high quantum yield and increased operating speed by tuning the quantum well film.

Further, by combining a preferred embodiment high speed driver such as in FIGS. 3-5B with a preferred embodiment ultrathin metal on silicon Schottky barrier photodetector such as the grating photodetector 282 and a suitable optical transmission medium, the preferred embodiment provides a low cost high performance optical data channel. Thus, the optical transmission medium may be selected for the particular application, i.e., open air for short distances where alignment is not a problem or optical fiber for longer ranges. Further, with a single chip driver as in FIG. 3 and a grating photodetector 260 of FIG. 12 driving a standard CMOS sense amplifier on a standard CMOS chip, a preferred data channel assembly suffers few if any of the disadvantages of connecting components together encountered with prior art data channels.

Figure 15A:
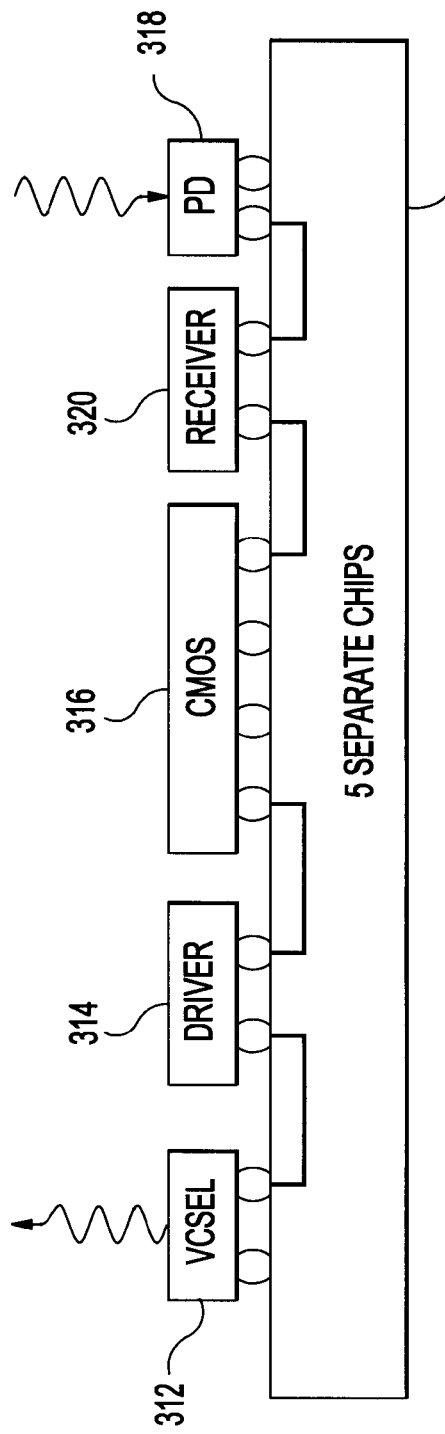
FIGS. 15A-B show a comparison of prior art photoreceiver/driver with a preferred embodiment example.
Figure 15B:
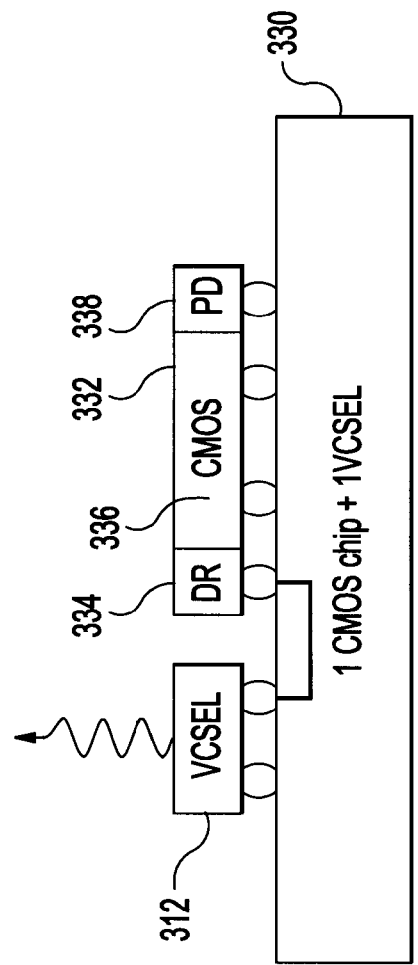

FIGS. 15A-B show a comparison of prior art photoreceiver/driver with a preferred embodiment example. Thus, FIG. 15A shows a substrate 310, e.g., in a multichip module, with an individual VCSEL diode 312, diode driver 314, general purpose CMOS IC (e.g., a microprocessor) 316, a compound semiconductor photodetector 318 and a receiver chip 320. The photodetector 318 drives the receiver 320, which is attached to the CMOS IC 316. The CMOS IC 316 drives the diode driver 314 which drives the VCSEL diode 312. By contrast, the preferred embodiment substrate 330 has reduced chip count to 2 with CMOS IC 332 providing all of the function of a diode driver 334, general purpose CMOS circuit 336, silicon photoreceiver 338 in a single integrated CMOS chip 332. In this embodiment, only the VCSEL diode 312 is on a separate chip wired to the CMOS IC 332.

Advantageously, because chip count is reduced, so is power, substrate size and board real estate required for the module. Also, all or most of the function, previously in expensive compound semiconductors is containable on a single CMOS IC. Therefore, a significant performance again and cost reduction is achieved because of the photodetector, photoreceiver and VCSEL diode driver of the present invention.

While the invention has been described in terms of several (example) preferred embodiments, those skilled in the art will recognize that the invention can be practiced with modification within the spirit and scope of the appended claims.

We claim:

1. A high speed integrated optical driver comprising:
   a field effect transistor (FET) driver circuit;
   a passive element coupled at one end to an output of said FET driver circuit;
   wherein said passive element is at least five (5) stacked loops forming an integrated loop inductor, the inductance of said loop inductor is 25-50 nH and, wherein each of said at least 5 stacked loops is rectangular and at least 200 um on each side;
   a vertical cavity surface emitting laser (VCSEL) diode coupled at an anode to said passive element; and
   a bias connection coupled to a cathode of said VCSEL diode.

2. A high speed integrated optical driver as in claim 1, wherein said output is attached to said VCSEL diode anode.

3. A high speed integrated optical driver as in claim 2, wherein said passive element and said FET driver are on the same integrated circuit chip.

4. A high speed integrated optical driver as in claim 2, wherein said passive element and said VCSEL diode are on the same integrated circuit chip.

5. A high speed integrated optical driver as in claim 2, wherein said passive element is a plurality of stacked loops forming an integrated loop inductor.

6. A high speed integrated optical driver as in claim 5, wherein said plurality of stacked loops is at least five (5) loops.

7. A high speed integrated optical driver as in claim 6, wherein each of said plurality of stacked loops is rectangular and at least 200 μm on each side.

8. A high speed integrated optical driver as in claim 5, wherein the inductance of said loop inductor is at least 25-40 nH.

9. A high speed integrated optical driver as in claim 2, wherein said FET driver is a CMOS driver.

10. A high speed integrated optical driver as in claim 9 further comprising a bias supply connected to said bias connection.

11. A high speed integrated optical driver as in claim 10, wherein the magnitude of said bias supply exceeds the CMOS supply voltage.

12. A high speed integrated optical driver as in claim 10, wherein said VCSEL diode is biased at its threshold voltage ($V_{th}$).

13. A high speed integrated optical driver as in claim 1, wherein said high speed integrated optical driver is capable of operating at least at 10 gigabits per second (Gbps).

14. A high speed integrated optical driver as in claim 1, wherein said VCSEL has an 850 nm wavelength.

15. A high speed integrated optical driver as in claim 2, wherein said passive element is a 200-400 ohm (200-400 Ω) resistor.

16. A high speed integrated CMOS optical driver comprising:
  a CMOS driver;
  a passive element coupled at one end to an output of said CMOS driver;
  wherein said passive element is at least five (5) stacked loops forming an integrated loop inductor, the inductance of said loop inductor is 25-50 nH and, wherein each of said at least 5 stacked loops is rectangular and at least 200 um on each side;
  a vertical cavity surface emitting laser (VCSEL) diode coupled at an anode to said passive element; and
  a bias connection coupled to a cathode of said VCSEL diode.

17. A high speed integrated CMOS optical driver as in claim 16, wherein said output is attached to said VCSEL diode anode.

18. A high speed integrated CMOS optical driver as in claim 17, further comprising a bias supply connected to said bias connection.

19. A high speed integrated CMOS optical driver as in claim 18, wherein the magnitude of said bias supply exceeds the CMOS supply voltage.

20. A high speed integrated CMOS optical driver as in claim 19, wherein said VCSEL diode is biased at its threshold voltage ($V_{th}$).

21. A high speed integrated CMOS optical driver as in claim 20, wherein said passive element is a plurality of stacked loops forming an integrated loop inductor.

22. A high speed integrated CMOS optical driver as in claim 21, wherein said plurality of stacked loops is at least five (5) loops.

23. A high speed integrated CMOS optical driver as in claim 21, wherein each of said plurality of stacked loops is rectangular and at least 200 μm on each side.

24. A high speed integrated CMOS optical driver as in claim 21, wherein said passive element and said VCSEL diode are on the same integrated circuit chip.

25. A high speed integrated CMOS optical driver as in claim 16, wherein said CMOS driver is capable of operating at least at 10 gigabits per second (Gbps).

26. A high speed integrated CMOS optical driver as in claim 16, wherein said VCSEL has an 850 nm wavelength.

27. A high speed integrated CMOS optical driver as in claim 16, wherein said passive element is a 200-400 ohm (200-400 Ω) resistor.

28. A CMOS integrated circuit (IC) including a high speed optical driver capable of operating at least at 10 gigabits per second (Gbps), said high speed optical driver comprising:
  a CMOS driver;
  a passive element coupled at one end to an output of said CMOS driver;
  wherein said passive element is at least five (5) stacked loops forming an integrated loop inductor, the inductance of said loop inductor is 25-50 nH and, wherein each of said at least 5 stacked loops is rectangular and at least 200 um on each side;
  a vertical cavity surface emitting laser (VCSEL) diode coupled at an anode to said passive element; and
  a bias connection, a cathode of said VCSEL diode being coupled to said bias connection.

29. A CMOS IC as in claim 28, wherein said output is attached to said VCSEL diode anode.

30. A CMOS IC as in claim 29, wherein said passive element is a plurality of stacked loops forming an integrated loop inductor.

31. A CMOS IC as in claim 30, wherein said plurality of stacked loops is at least five (5) loops.

32. A CMOS IC as in claim 31, wherein each of said plurality of stacked loops is rectangular and at least 200 μm on each side.

33. A CMOS IC as in claim 30 connected to a bias supply at said bias connection.

34. A CMOS IC as in claim 33, wherein the magnitude of said bias supply exceeds the CMOS driver voltage.

35. A CMOS IC as in claim 34, wherein said bias supply biases said VCSEL diode its threshold voltage ($V_{th}$).

36. A CMOS IC as in claim 35, wherein said VCSEL has an 850 nm wavelength.

37. A CMOS IC as in claim 29, wherein said passive element is a 200-400 ohm (200-400 Ω) resistor.

* * * * *